(12) United States Patent
Buynoski et al.

(10) Patent No.: US 6,544,872 B1
(45) Date of Patent: Apr. 8, 2003

(54) DOPANT IMPLANTATION PROCESSING FOR IMPROVED SOURCE/DRAIN INTERFACE WITH METAL SILICIDES

(75) Inventors: Matthew S. Buynoski, Palo Alto, CA (US); Qi Xiang, San Jose, CA (US); George Jonathan Kluth, Los Gatos, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/819,598

(22) Filed: Mar. 29, 2001

Related U.S. Application Data
(60) Provisional application No. 60/268,963, filed on Feb. 16, 2001.

(51) Int. Cl.[7] .................. H01L 21/3205; H01L 21/4763
(52) U.S. Cl. ....................................................... 438/586
(58) Field of Search ......................................... 438/586

(56) References Cited

U.S. PATENT DOCUMENTS

| | | | | |
|---|---|---|---|---|
| 5,115,296 A | * | 5/1992 | Hsue et al. .................. 257/344 |
| 5,389,809 A | * | 2/1995 | Haken et al. ................ 257/344 |
| 6,297,114 B1 | * | 10/2001 | Iwata et al .................. 438/305 |
| 6,300,206 B1 | * | 10/2001 | Fukada et al. ............... 438/303 |
| 6,362,095 B1 | * | 3/2002 | Woo et al. ................... 438/649 |
| 6,376,343 B1 | * | 4/2002 | Buynoski et al. ........... 438/529 |
| 2002/0146904 A1 | * | 10/2002 | Buynoski et al. ........... 438/682 |

OTHER PUBLICATIONS

Miglio, et al., Silicides, Fundamentals and Applications, World Scientific, 2000, p. 251.*
Jaeger, Richard C., Introduction to Microelectronic Fabrication, vol. V, Addison–Wesley, 1993, p. 7.*

* cited by examiner

*Primary Examiner*—Richard Elms
*Assistant Examiner*—Michael K. Luhrs

(57) ABSTRACT

Deleterious roughness of metal silicide/doped Si interfaces arising during conventional salicide processing for forming shallow-depth source and drain junction regions of MOS transistors and/or CMOS devices is avoided, or at least substantially reduced, by increasing the dopant implantation energy to position the maximum source/drain dopant concentration depth below rather than above the depth to which silicidation reaction occurs, thereby minimizing the concentration of dopant in the metal silicide. The invention enjoys particular utility in forming NiSi layers on As-doped Si substrates.

17 Claims, 4 Drawing Sheets

DOPANT IMPLANTATION PROCESSING FOR IMPROVED SOURCE/DRAIN INTERFACE WITH METAL SILICIDES

CROSS-REFERENCE TO PROVISIONAL APPLICATION

This application claims priority from U.S. provisional patent application Ser. No. 60/268,963, filed Feb. 16, 2001, the entire disclosure of which is incorporated herein by reference.

CROSS-REFERENCE TO RELATED APPLICATIONS

This application contains subject matter similar to subject matter disclosed in U.S. patent application Ser. No. 09/812,695, filed on Mar. 21, 2001, now U.S. Pat. No. 6,376,343 and Ser. No. 09/813,308, filed on Mar. 21, 2001.

FIELD OF THE INVENTION

The present invention relates to a method of manufacturing semiconductor devices, e.g., high-density integrated circuit ("IC") semiconductor devices exhibiting reliable, high quality, adherent, low resistance, well-aligned contacts to source, drain, and gate regions of active devices, such as MOS and CMOS transistors formed in or on a semiconductor substrate, by utilizing self-aligned, metal silicide ("salicide") processing methodology. The present invention enjoys particular utility in the manufacture of high-density integration semiconductor devices, including multi-level devices, having design rules of 0.18 μm and below, e.g., 0.15 μm and below.

BACKGROUND OF THE INVENTION

The escalating requirements for high density and performance associated with ultra-large scale integration (ULSI) devices necessitate design rules of 0.18 μm and below, such as 0.15 μm and below, with increased transistor and circuit speeds, high reliability, and increased manufacturing throughput. The reduction in feature sizes, e.g., of source, drain, and gate regions of transistors formed in or on a common semiconductor substrate, challenges the limitations of conventional contact and interconnection technology, including conventional photo-lithographic, etching, and deposition techniques.

As a result of the ever-increasing demand for large-scale and ultra small-dimensioned IC devices, self-aligned techniques have become the preferred technology for forming such devices in view of their simplicity and capability of high-density integration. As device dimensions decrease in the deep sub-micron range, both vertically and laterally, many problems arise, especially those caused by an increase in the sheet resistance of the contact areas to the source and drain regions and junction leakage as junction layer thickness decreases. To overcome this problem, the use of self-aligned, highly electrically conductive metal silicides, i.e., "salicides" (derived from Self-ALIgned-siliCIDE), has become commonplace in the manufacture of IC semiconductor devices comprising, e.g., MOS type transistors. Another technique employed in conjunction with metal suicide technology is the use of lightly-doped, shallow-depth source and drain extensions formed just at the edge of the gate region, while more heavily-doped source and drain regions, to which ohmic contact is to be provided, are laterally displaced away from the gate by provision of sidewall spacers on opposing sides of the gate electrode.

Salicide processing involves deposition of a metal that forms an intermetallic compound with silicon (Si), but does not react with silicon oxides, nitrides, or oxynitrides under normal processing conditions. Metals commonly employed in salicide processing include platinum (Pt), titanium (Ti), nickel (Ni), and cobalt (Co), each of which forms very low resistivity phases with Si, e.g., $PtSi_2$, $TiSi_2$, $NiSi$, and $CoSi_2$. In practice, the metal is deposited in a uniform thickness over all exposed surface features of a Si wafer, preferably by means of physical vapor deposition ("PVD") process, e.g., sputtering from an ultra-pure target utilizing an ultra-high vacuum, multi-chamber DC magnetron sputtering system. In MOS transistor formation, deposition is generally performed after both gate etch and after source/drain formation. After deposition, the metal layer blankets the top surface of the gate electrode, typically formed of a heavily-doped polysilicon, the silicon oxide, nitride, or oxynitride sidewall spacers on the opposing side surfaces of the gate electrode, the silicon oxide isolation regions formed in the Si substrate between adjacent active device regions, and the exposed surfaces of the substrate where the source and drain regions are to be formed or will subsequently be formed. As a result of thermal processing, e.g., a rapid thermal annealing ("RTA"), the metal layer reacts with underlying Si to form electrically conductive metal silicide layer portions on the top surface of the polysilicon gate electrode and on the exposed surfaces of the substrate where source and drain regions are or will be formed. Unreacted portions of the metal layer, e.g., on the silicon oxide, nitride, or oxynitride sidewall spacers and the silicon oxide isolation regions, are then removed, as by a wet chemical etching process selective to the metal silicide portions. In some instances, e.g., with Co, a first RTA step may be performed at a relatively lower temperature in order to form first-phase CoSi, which is then subjected to a second RTA step performed at a relatively high temperature to convert the first-phase CoSi to second-phase, lower resistivity $CoSi_2$.

A number of different techniques and fabrication processes have been either proposed or utilized for forming MOS transistors and/or CMOS devices according to salicide methodology. Referring to FIGS. 1(A)–1(I), shown therein, for illustrative purposes only, is an example of a typical salicide-based process according to conventional processing technology. In a preliminary step, shown in FIG. 1(A), a silicon (Si) or Si-based substrate 102, typically a monocrystalline Si wafer of one conductivity type (p or n) or comprising a well region of one conductivity type formed therein, is processed, as by conventional techniques such as formation of field oxide regions, local oxidation of silicon ("LOCOS"), shallow trench isolation ("STI"), etc., to define a plurality of electrically separated regions. In the illustrated embodiment, shallow isolation trenches 216 (only one is shown for illustrative simplicity) are formed in a surface portion of substrate 102, as by isotropic etching utilizing wet chemical etching techniques or by anisotropic etching utilizing dry etching techniques, e.g., reactive plasma etching. Trenches 216 are then filled with an oxide 218 layer, such that an edge 220 of the oxide 218 contacts the substrate 102 at locations where doped regions will subsequently be formed within the substrate 102. (Trench 216 and oxide layer 218 are not shown in the following drawing figures for illustrative simplicity).

Referring now to FIG. 1(B), a thin gate oxide (insulator) layer 104, typically a silicon oxide layer about 15–50 Å thick, is formed on the upper surface of substrate 102, e.g., by thermal oxidation at temperatures of from about 700 to about 1,000° C. in an oxidizing atmosphere. After formation of the gate oxide layer 104, a blanket layer of undoped polysilicon 106 is deposited on the gate oxide layer 104, for example, by low pressure chemical vapor deposition ("LPCVD"). If desired, polysilicon layer 106 can be treated to retard diffusion of boron (B) atoms therethrough, as by implantation with nitrogen ($N_2$) ions, symbolically indicated in the figure by arrows 160.

Adverting to FIG. 1(C), a continuous photoresist layer 110 is then deposited on the polysilicon layer 106, and the photoresist layer 110 is selectively irradiated utilizing photolithographic masking techniques and developed, followed by removal of the selectively irradiated portions thereof to expose portions of the polysilicon layer 106 which are to be removed to define a gate electrode. As shown in FIG. 1(D), the exposed portions of polysilicon layer 106 and the respective underlying portions of the thin gate oxide layer 104 are removed, as by anisotropic etching, to form polysilicon gate electrode 112 having vertically opposed sidewalls or edges 114, 116.

With reference to FIG. 1(E), the remaining portion of the photoresist layer 110 is then stripped from the upper surface of the polysilicon gate electrode 112 and a pair of shallow-depth, source and drain extension regions 130, 132 are formed in substrate 102 by an ion implantation 128 ("extension implant") process, utilizing the polysilicon gate electrode 112 as an implantation mask. Source and drain extension regions 130, 132 thus are formed in a self-aligned manner and extend within the substrate 102 to immediately adjacent the edges of sidewalls 114, 116 of the gate electrode/gate oxide layer stack 112/104. The implanted ions may comprise an n-type dopant, e.g., As ions, if an NMOS is desired to be formed, or a p-type dopant, e.g., B-containing ions, if a PMOS is to be formed. By way of illustration only, n-type source and drain extension regions 130, 132 having a shallow-depth of from about 100 to about 200 Å and a doping of from about $1 \times 10^{20}$ to about $1 \times 10^{21}$ da/$cm^3$ may be formed in crystalline Si by implanting As ions at a dosage of from about $1 \times 10^{15}$ to about $2 \times 10^{15}$ da/$cm^2$ and energies of from about 2 to about 5 KeV.

Referring now to FIG. 1(F), tapered width sidewall spacers 162, 164 comprised of an insulative material, typically a silicon oxide, nitride, or oxynitride, are then formed on the surfaces of sidewalls 114, 116 of the gate electrode/gate oxide layer stack 112/104. Typically, the tapered width sidewall spacers 162, 164 are formed by a process comprising forming, as by a suitable conventional deposition method, a blanket layer of the insulative material covering all exposed surface portions of the substrate 102 as well as all exposed surfaces of the various features formed therein or thereon, including, inter alia, the opposing sidewall surfaces 114, 116 and top surface of the polysilicon gate electrode 112. The thickness of the blanket insulative layer is selected so as to provide tapered sidewall spacers 162, 164 having a desired width profile. The blanket insulative layer is then subjected to an anisotropic etching process, e.g., plasma etching in a fluorine-containing plasma, for selectively removing the laterally extending portions thereof and forming the tapered width sidewall spacers 162, 164. Following the formation of the tapered sidewall spacers 162, 164, a pair of deeper source and drain regions 200, 202 are formed, as by a "main implant" ion implantation 204 process utilizing the tapered sidewall spacers 162, 164 as implantation masks, generally within the portions of substrate 102 where the shallow-depth, source and drain extension regions 130, 132 were previously formed. As shown in the figure, the deeper source and drain regions 200, 202 formed by the "main implant" process extend beyond the depth of source and drain extension regions 130, 132, except at the portions of the latter regions underlying the sidewall spacers 162, 164. By way of illustration only, according to conventional practice, typical As implantation conditions for forming source and drain regions 200, 202 of a Si wafer-based NMOS transistor having a peak As n-type dopant concentration of from about $1 \times 10^{20}$ to about $1 \times 10^{21}$ da/$cm^3$ at a depth of from about 200 to about 400 Å below the surface of the Si wafer include dosages of from about $3 \times 10^{15}$ to about $6 \times 10^{15}$ da/$cm^2$ and energies of from about 10 to about 40 KeV.

With reference to FIG. 1(G), in a following step, a blanket layer 140 of a metal, typically Pt, Co, Ni, or Ti, is formed, as by a PVD process such as DC sputtering, to cover all exposed surfaces of the thus-formed structure. The thickness of the metal layer deposited in this step depends upon several factors, including, inter alia, the particular selected metal, its Si consumption ratio, and desired thickness (hence resistance) of the resultant metal silicide.

Adverting to FIG. 1(H), following metal layer 140 deposition, a thermal treatment, typically RTA, is performed at a temperature and for an interval sufficient to convert at least a portion of the thickness of metal layer 140 to the corresponding electrically conductive metal silicide 142, e.g., $PtSi_2$, $CoSi_2$, NiSi, or $TiSi_2$. Since the metal silicide 142 forms only where the metal layer 140 is in contact with underlying Si of Si substrate 102, the unreacted portions of the metal layer 140 formed over the sidewall spacers 162, 164 and oxide-filled isolation trenches 216 (not shown in the figure for simplicity) are selectively removed, as by a wet chemical etch process, to yield the structure shown in FIG. 1(I), which structure can then undergo further processing for contact formation to the source/drain regions and gate electrode.

When Ni is utilized as the metal layer 140, conversion of Ni to NiSi may be accomplished by means of a one-step thermal process, typically RTA performed at temperatures of from about 350 to about 750° C., for example, in a $N_2$ atmosphere at 550° C. for about 40 sec. The formation of NiSi commences at about 250° C., when the Ni layer 140 reacts with the Si substrate 102 to form $Ni_2Si$. With increase in reaction time or temperature to above about 300° C., the $Ni_2Si$ undergoes further reaction with the Si substrate 102 to form NiSi layer 142. By way of illustration only, a Ni layer 140 from about 100 to about 200 Å thick may be subjected to silicidation reaction with the Si substrate 102 (as described above) to form a NiSi layer 142 extending to a depth below the Si substrate 102 of from about 180 to about 360 Å. Removal of any unreacted portions of Ni layer 140 can be accomplished, for example, by etching with a 2:1 $H_2SO_4/H_2O_2$ mixture at a temperature of about 100° C. An aqueous mixture of $NH_4OH$ and $H_2O_2$ may be utilized for stripping other unreacted metals, i.e., Co, Ti, Pt.

Referring now to FIG. 2, a problem frequently encountered with salicide processing sequences, such as the one described supra, is the formation of metal silicide layers 142 wherein the lower surfaces 142L thereof are rough at the metal silicide/Si interfaces 143, which roughness can disadvantageously result in penetration of the underlying silicon substrate 102 by the metal silicide layer 142. In particular, such penetration, or "spiking" of the Si substrate 102 in the regions below the source and drain regions 200, 202 can cause local electrical punch-through of the source and drain junctions 204, 206 for example, as indicated by 204LS, 206LS, respectively, in the figure, thereby resulting in junction leakage. While the effect of local electrical punch-through or spiking is significant when a metal having a high Si consumption ratio is utilized, e.g., Co, silicide/Si interface roughness resulting in local electrical punch-through can also result from incompatibility between a particular metal and a particular dopant species utilized for forming the source and drain regions. In this regard, a notable (but not exclusive) example is the incompatibility of Ni as the metal and As atoms/ions as the n-type dopant species for Si, e.g., in the formation of Si-based NMOS transistors and CMOS devices.

Specifically, the presence of significant amounts of As in NiSi layers on source/drain regions of NMOS transistors and CMOS devices results in a substantial amount or degree of roughness at the NiSi/Si interface, leading to increased junction leakage due to local electrical punch-through or "spiking" of the source/drain junctions as described above. Further, since As atoms or ions tend to be rejected, (i.e., expelled) from NiSi films, they can accumulate in the vicinity of the NiSi/Si interface and below, thereby exacerbating the problem of local junction electrical punch-through and disadvantageously altering the dopant concentration vs. depth profile so as to degrade transistor properties. Such incompatibility with NiSi is peculiar to As (i.e., it is not observed with other n-type dopant species) and is particularly troublesome in that (1) As is otherwise advantageous vis-à-vis the other common n-type dopant species (i.e., phosphorus (P) and antimony (Sb)) utilized in forming ion implanted, shallow junction source and drain regions in high-speed, Si-based NMOS transistors and CMOS devices, in view of its low diffusivity (with respect to P) and high solid solubility (with respect to Sb); and (2) NiSi is a preferred electrically conductive, metal silicide material vis-à-vis other metal silicides ($CoSi_2$, $TiSi_2$, $PtSi_2$, etc.) in view of its rapid formation at relatively low temperatures (350–600° C.) in a one-step RTA process, lack of line width dependence, low resistivity, low Si consumption ratio, and increased process flexibility.

Accordingly, there exists a clear need for improved methodology for simple, reliable, and rapid formation of metal suicide layers for use in the manufacture of semiconductor IC devices, e.g., in the formation of electrically conductive contact layers to dopant-containing source and drain regions in MOS transistors and/or CMOS devices, which methodology avoids the drawbacks associated with the conventional salicide techniques and methodologies and provides, inter alia, high-quality MOS transistors and/or CMOS devices exhibiting reduced junction leakage and improved transistor characteristics and properties.

The present invention, wherein the peak of the concentration vs. depth profile of a conductivity-determining dopant species introduced into a semiconductor substrate, e.g., for forming source and drain regions therein, is shifted to a lower than conventional depth in the substrate which is displaced from the depth to which a metal silicide is subsequently formed, thereby reducing the concentration of the dopant species in the metal silicide below a threshold level at which adverse affects are observed, eliminates, or at least substantially reduces, the disadvantageous interaction(s) between the metal silicide and the dopant species leading to roughness of the metal silicide/silicon interface and local electrical punch-through of the source/drain junctions. The inventive methodology thus effectively addresses and solves the need for improved methodology for the manufacture of high-quality MOS transistors and/or CMOS devices with reduced junction leakage due to local electrical punch-through of the source and drain junctions arising from the rough interface. Further, the methodology provided by the present invention enjoys diverse utility in the manufacture of numerous and various types of semiconductor devices and/or components employing salicide technology.

DISCLOSURE OF THE INVENTION

An advantage of the present invention is an improved method for forming an electrically conductive metal silicide layer on a Si-based semiconductor substrate.

Another advantage of the present invention is an improved method for forming an electrically conductive NiSi layer on an As-doped, n-type region of a Si semiconductor substrate.

Yet another advantage of the present invention is an improved method of manufacturing a Si-based NMOS transistor or CMOS device including electrically conductive NiSi layers formed in contact with As-doped, n-type source and drain regions.

Still another advantage of the present invention is improved Si-based semiconductor devices comprising at least one electrically conductive NiSi layer formed in contact with an As-containing, n-type Si region.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of manufacturing a semiconductor device, which method comprises the steps of:

(a) providing a silicon (Si)-based semiconductor substrate having a surface;

(b) introducing a first conductivity type first dopant into at least one selected portion of the substrate, such that the concentration vs. depth profile of the first dopant has a peak at a first depth below the substrate surface;

(c) introducing a second conductivity type second dopant into the at least one selected portion of the substrate, such that the concentration vs. depth profile of the second dopant has a peak at a second depth below the substrate surface, the second depth being greater than the first depth, whereby the first depth is controlled/limited by the second depth;

(d) forming a metal layer on the substrate surface overlying the at least one selected portion of the substrate;

(e) reacting the metal layer with the at least one selected portion of the Si-based substrate to form a layer of an electrically conductive metal suicide extending below the substrate surface to a third depth which is less than the first depth, thereby eliminating or at least substantially reducing roughness of the at least one interface between the metal silicide layer and the at least one selected portion of the Si substrate by minimizing the concentration of the first dopant in the metal suicide layer.

According to embodiments of the present invention, step (b) comprises implanting the first conductivity type first dopant, e.g., implanting an n-type first dopant comprising at least one member selected from the group consisting of arsenic (As), phosphorus (P), and antimony (Sb).

According to particular embodiments of the present invention, step (b) comprises implanting As ions as the n-type first dopant.

According to further embodiments of the present invention, step (c) comprises implanting a p-type second dopant, e.g., step (c) comprises implanting boron (B)-containing ions as the p-type second dopant; and the method comprises either performing step (b) followed by step (c) or performing step (c) followed by step (b).

According to still further embodiments of the present invention, step (d) comprises forming a metal layer comprising at least one metal selected from the group consisting of: nickel (Ni), cobalt (Co), titanium (Ti), and platinum (Pt).

According to particular embodiments of the present invention, step (d) comprises forming a Ni layer; and step (e) comprises forming an electrically conductive NiSi layer.

According to yet further embodiments of the present invention, step (b) comprises implanting As n-type dopant ions as the first dopant for forming n-type source and drain regions in selected portions of the substrate as part of a process for forming an NMOS transistor or CMOS device; step (c) comprises implanting boron (B)-containing p-type dopant ions as the second dopant; step (d) comprises forming a Ni layer overlying at least the selected portions of the substrate; and step (e) comprises reacting the Ni layer with the Si-based substrate to form a layer of electrically conductive nickel silicide (NiSi).

According to particular embodiments of the present invention, step (a) comprises providing a monocrystalline Si wafer substrate; step (b) comprises implanting As ions as said first dopant ions at a dosage and energy such that the first depth is from about 250 to about 500 Å below said substrate surface; step (c) comprises implanting B-containing second dopant ions at a dosage and energy such that the second depth is from about 450 to about 700 Å below the substrate surface; step (d) comprises forming a Ni layer having a thickness of from about 100 to about 200 Å; and step (e) comprises reacting the Ni layer with the Si substrate to form an electrically conductive NiSi layer extending to the third depth below the substrate surface of from about 180 to about 360 Å, wherein: step (b) comprises implanting As ions at a dosage of from about $3 \times 10^{15}$ to about $6 \times 10^{15}$ da/cm$^2$ and energy of from about 35 to about 85 KeV; step (c) comprises implanting B-containing ions at a dosage of from about $3 \times 10^{13}$ to about $1 \times 10^{14}$ da/cm$^2$ and an energy of from about 14 to about 22 KeV; and step (d) comprises heating the Ni in an inert atmosphere at a temperature of from about 300 to about 550° C. for from about 30 to about 60 sec.

According to another aspect of the present invention, a method of manufacturing an NMOS transistor or CMOS semiconductor device comprises the steps of:

(a) providing a Si semiconductor substrate having a surface;

(b) forming a thin gate insulator layer in contact with the substrate surface;

(c) forming an electrically conductive gate electrode on a portion of the thin gate insulator layer, the gate electrode comprising first and second opposing side surfaces and a top surface;

(d) forming a pair of shallow-depth, n-type source and drain extension regions in portions of the substrate, each of the source and drain extension regions extending laterally to beneath an edge of a respective one of the first and second opposing side surfaces of the gate electrode;

(e) forming sidewall spacers composed of an insulating material on each of the first and second opposing side surfaces of the gate electrode;

(f) forming, by implantation of As n-type dopant ions utilizing the sidewall spacers as an implantation mask, a pair of deeper, n-type source and drain regions in the source and drain regions formed in step (d), such that the concentration vs. depth profile of the implanted As ions has a peak at a first depth below the substrate surface;

(g) implanting B-containing p-type dopant ions into the pair of n-type source and drain regions utilizing the sidewall spacers as an implantation mask, such that the concentration vs. depth profile of the implanted B-containing dopant ions has a peak at a second depth below the substrate surface, the second depth being greater than the first depth, whereby the first depth is controlled/limited by the second depth;

(h) forming a layer of Ni on the substrate surface overlying at least the pair of source and drain regions; and (i) reacting the Ni layer with the Si semiconductor substrate to form an electrically conductive NiSi layer extending into the pair of source and drain regions for a third depth below the substrate surface, the third depth being less than the first depth, thereby eliminating or at least substantially reducing roughness of the interfaces between the NiSi layers and the As-doped source and drain regions by minimizing the concentration of As ions in the NiSi layer.

According to embodiments of the present invention, the method comprises either performing step (f) followed by step (g), or performing step (g) followed by step (f).

According to particular embodiments of the present invention, step (d) comprises forming the pair of n-type source and drain extension regions at a shallow depth of from about 100 to about 200 Å; step (f) comprises implanting the As dopant ions at a dosage and energy such that the first depth is from about 250 to about 500 Å below the substrate surface; step (g) comprises implanting the B-containing dopant ions at a dosage and energy such that the second depth is from about 450 to about 700 Å below the substrate surface; step (h) comprises forming a Ni layer having a thickness of from about 100 to about 260 Å; and step (i) comprises reacting the Ni layer with the Si substrate to form a NiSi layer extending to the third depth below the substrate surface of from about 180 to about 360 Å; wherein step (d) comprises implanting As ions at a dosage of from about $1 \times 10^{15}$ to about $2 \times 10^{15}$ da/cm$^2$ and energy of from about 2 to about 5 KeV; step (f) comprises implanting As ions at a dosage of from about $3 \times 10^{15}$ to about $6 \times 10^{15}$ da/cm$^2$ and energy of from about 35 to about 85 KeV; step (g) comprises implanting B-containing ions at a dosage of from about $3 \times 10^{13}$ to about $1 \times 10^{14}$ da/cm$^2$ and energy of from about 14 to about 22 KeV; and step (i) comprises heating the Ni layer in an inert atmosphere at a temperature of from about 300 to about 550° C. for from about 30 to about 60 sec.

According to yet another aspect of the present invention, a semiconductor device comprises:

(a) a Si semiconductor substrate having a surface;

(b) at least one n-type doped region formed in the substrate, the n-type doped region comprising implanted As n-type dopant ions, the concentration vs. depth profile of the implanted As ions having a peak at a first depth below the substrate surface;

(c) an electrically conductive NiSi layer extending from the substrate surface into the at least one n-type, As-doped region to a second depth below the substrate surface, the second depth being less than the first depth; and (d) a p-type doped region formed in the substrate beneath the at least one n-type doped region, the p-type doped region comprising implanted B-containing dopant ions, the concentration vs. depth profile of the implanted B-containing dopant ions having a peak at a third depth below the substrate surface, wherein the second depth being less than the first depth eliminates or at least substantially reduces roughness at the interface between the NiSi layer and the As-doped region by minimizing the concentration of As ions in the NiSi layer, and the third depth being greater than the first depth controls/limits the first depth.

According to embodiments of the present invention, the at least one n-type As-doped region is a source or drain region of an NMOS transistor or a CMOS device.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWING

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

Figure 1A:
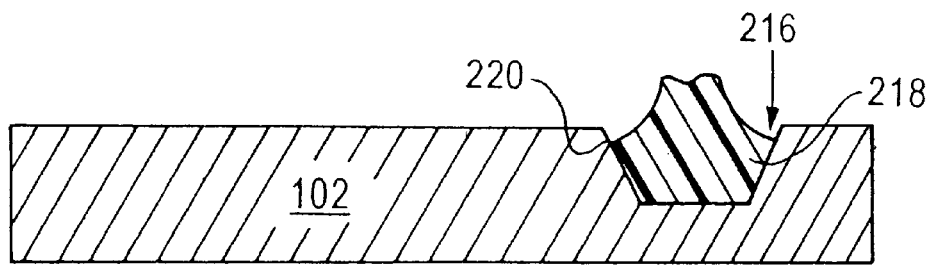
FIGS. 1(A)–1(I) are schematic, simplified, cross-sectional views illustrating stages in the formation of a MOS transistor according to conventional methodology.
Figure 1B:
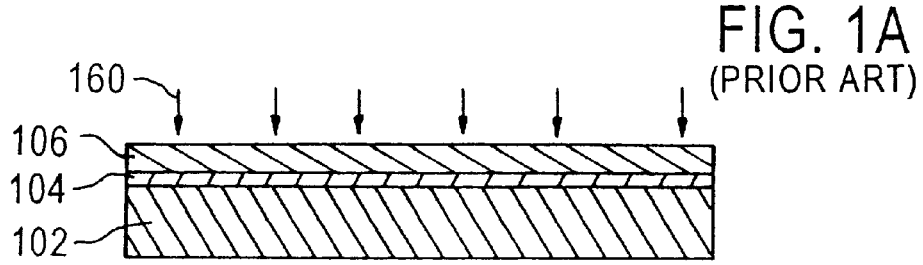
Figure 1C:
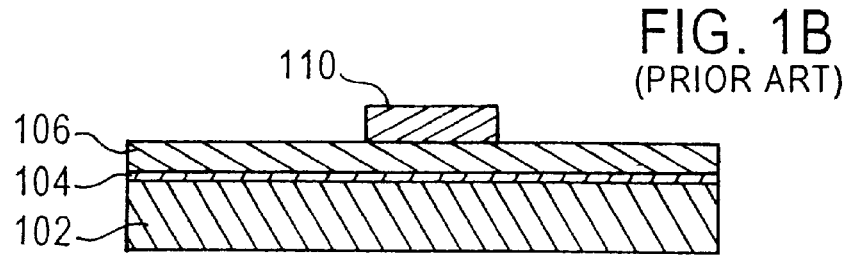
Figure 1D:
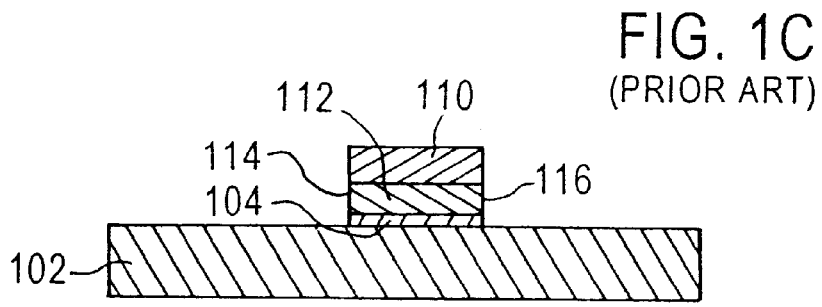
Figure 1E:
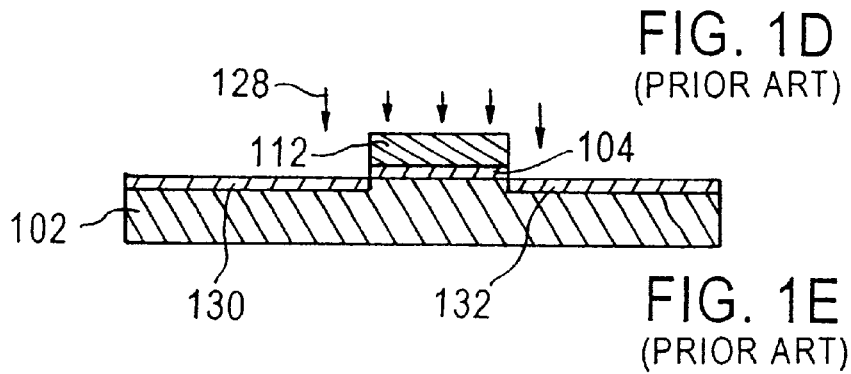

The present invention addresses and solves problems arising from manufacturing submicron-dimensioned, shallow junction MOS transistors and CMOS devices suitable for use in high-density integration semiconductor devices, wherein, as part of the fabrication methodology, electrically conductive metal silicide layers are formed in contact with doped semiconductor regions, e.g., source and drain regions. More specifically, the present invention advantageously provides an improvement in salicide technology by affording a significant and substantial reduction in the amount and severity of roughness of the metal silicide/Si interface exhibited with particular combinations of metals and dopant species, such as Ni and As, respectively. The inventive methodology thus provides significantly reduced local electrical punch-through or "spiking" of the source and drain junctions, typically manifested as increased junction leakage current. Moreover, the present invention provides increased device reliability while decreasing product yield problems associated with the conventional salicide technology. In addition, the inventive methodology is fully compatible with all other aspects of existing processing methodology.

The present invention is based upon the discovery that formation of high quality interfaces between electrically conductive metal silicides and dopant-containing, Si-based semiconductor layers or substrates, illustratively, but not limited to, NiSi/As-doped n-type Si interfaces, for use in MOS transistors and CMOS devices, can be readily formed by a process which generally follows conventional salicide processing, e.g., as illustrated in FIGS. 1(A)–1(I) but is modified in key respect to eliminate, or at least substantially reduce, disadvantageous roughness of the NiSi/Si interface leading to source/drain junction "spiking" manifesting in increased junction leakage current, by reducing the concentration of dopant in the Si layer or substrate in the region or stratum thereof where the silicidation reaction occurs to a level not exceeding a predetermined maximum level, below which roughness of the metal silicide/Si interface does not result. A key feature of the present invention is the introduction of the dopant species into the Si substrate, e.g., by ion implantation, such that the peak of the concentration vs. depth profile of the dopant species is controlled to be at a depth within the Si layer or substrate below that associated with the conventional salicide methodology, and the electrically conductive metal silicide layer is formed to the conventional depth, which depth is above that of the peak of the dopant concentration profile. As a consequence of the inventive methodology, the integrated value of dopant concentration, corresponding to the total amount of dopant in the region or stratum of the Si layer or substrate, is significantly reduced from that according to conventional practice, i.e., to a level below that necessary for metal silicide/Si interface roughness to occur. As a consequence of the inventive methodology, local electrical punch-through or "spiking", e.g., of source/drain junctions in MOS transistors and CMOS devices, is eliminated or at least substantially reduced, and reduced leakage current junctions are obtained. As a further consequence of the inventive methodology, high quality, Si-based, shallow-junction MOS transistors and CMOS devices can be reliably and conveniently fabricated in a cost-effective manner utilizing conventional manufacturing techniques and apparatus.

Figure 1F:
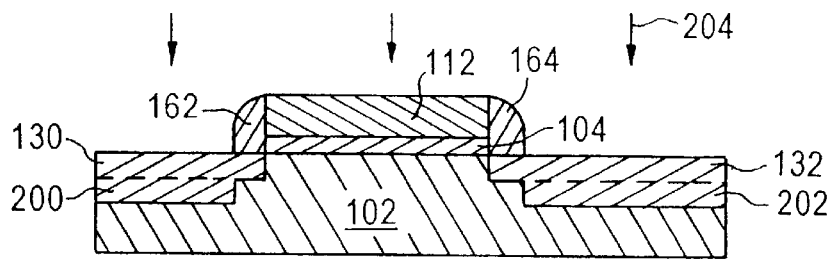
Figure 1G:
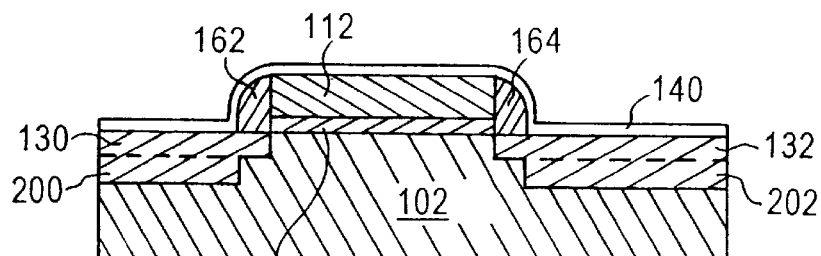
Figure 1H:
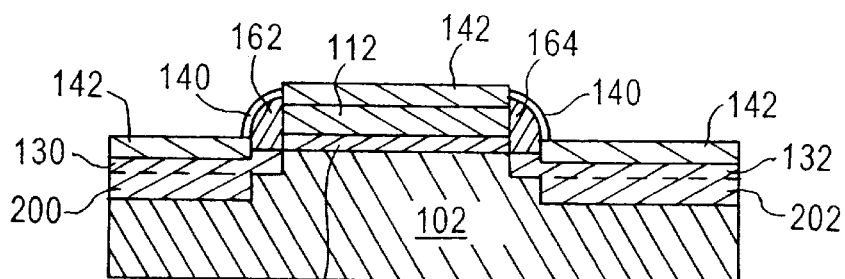
Figure 1I:
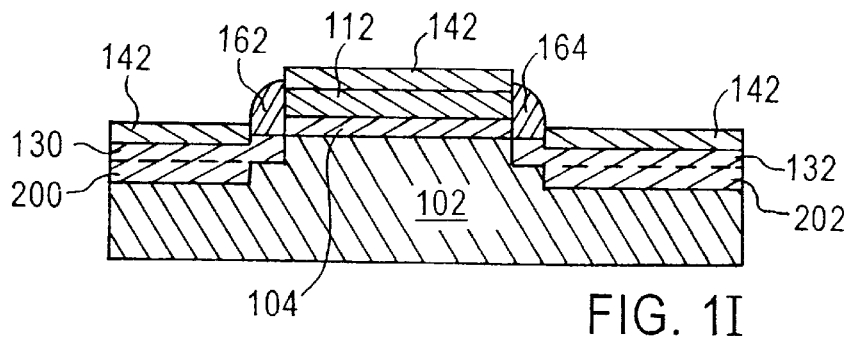
Figure 3A:
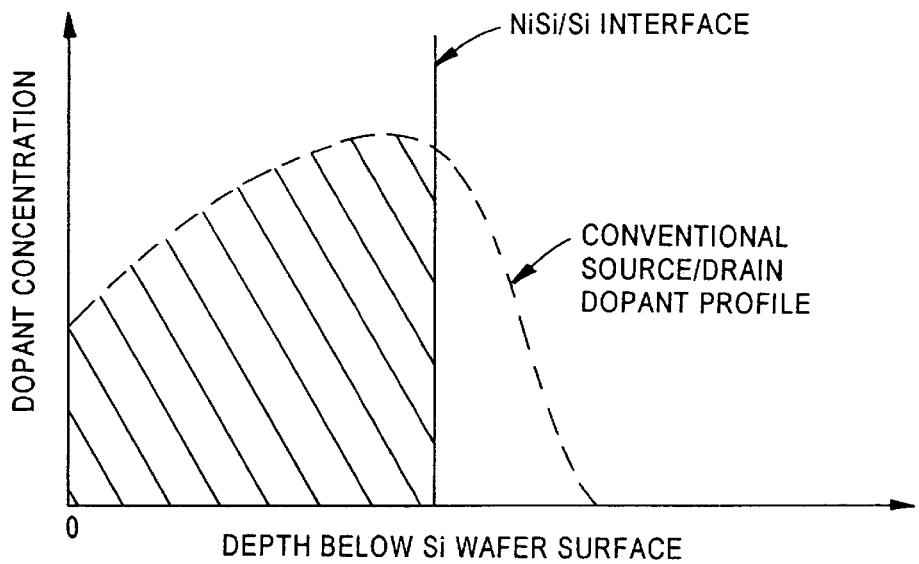
FIGS. 3(A)–3(B) are graphs illustrating dopant concentration vs. depth profiles for the main source/drain implantations performed according to the conventional and inventive methodologies, respectively.

Referring now to FIG. 3(A), shown therein, by way of illustration only, is the dopant concentration vs. depth profile for As-containing n-type dopant ions introduced into a monocrystalline Si wafer substrate as a result of performing a "main" implantation step for forming source and drain junctions as part of a process for forming MOS transistors and CMOS devices, i.e., corresponding to the situation which is obtained upon completion of the process stage illustrated in FIG. 1(F). As is apparent from the figure, according to the conventional methodology for implantation of As n-type dopant ions into monocrystalline Si wafer substrates for conducting the "main" implantation step of FIG. 1(F), e.g., at a dosage of from about $4 \times 10^{15}$ to about $6 \times 10^{15}$ da/cm$^2$ and ion energies of from about 30 to about 40 KeV, the As concentration vs. depth profile exhibits a significant As concentration at the Si surface and a peak As concentration of about $5 \times 10^{20}$ da/cm$^3$ at a depth of from about 200 to about 300 Å below the Si surface. In addition, the peak As concentration is at a depth within the Si substrate which is near the depth below the Si surface to which silicidation reaction to form NiSi layers conventionally occurs (i.e., depths of from about 180 to about 360 Å; Ni precursor layers of thickness of from about 100 to about 200 Å; and RTA at about 300–550° C. for about 30–60 sec.).

Figure 2:
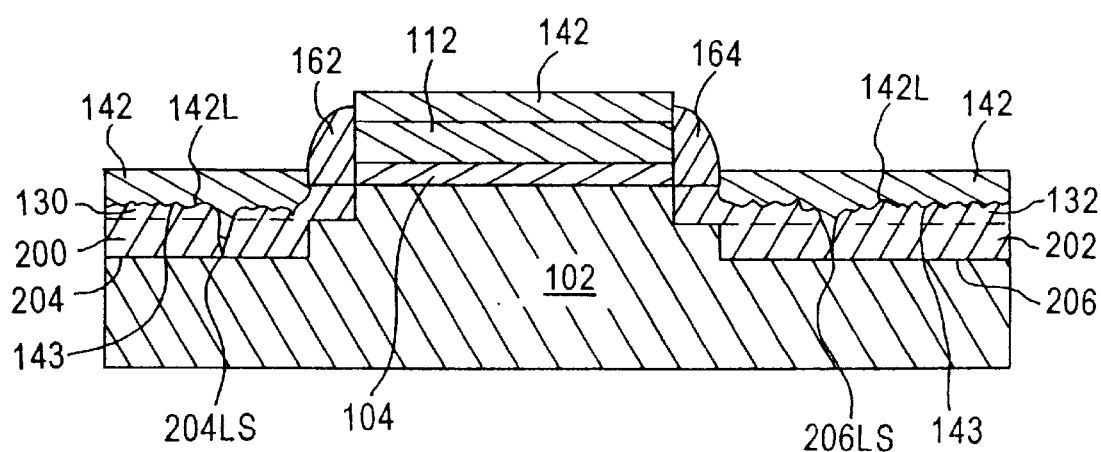
FIG. 2 is a schematic, simplified, cross-sectional view illustrating the effect of metal silicide/Si substrate interface roughness on local penetration of source/drain junctions.

The total amount, thus concentration, of As dopant ions initially contained in the region or stratum of the Si substrate subsequently subjected to silicidation reaction to form NiSi is indicated in the figure by the single-hatched lines. As is apparent from the figure, a significant total amount or concentration of As ions is at least initially present in the silicidation region or stratum (i.e., the region extending from the Si surface down to the indicated NiSi depth), and thus available for inclusion in the NiSi layer. Because of the tendency for As ions/atoms to be rejected (i.e., expelled) from NiSi and thus reduce their concentration in the NiSi, and if the concentration of As ions/atoms exceeds a threshold level, significant roughness occurs at the NiSi/Si interface as, for example, shown in FIG. 2, leading to local electrical punch-through of the source and drain junctions by the NiSi layers, manifesting in increased junction current leakage and diminished transistor characteristics.

While the exact mechanism for the increased roughness of the NiSi/Si interfaces which occurs with As-doped n-type Si is not known with certainty, and not wishing to be bound by any particular theory, it is nonetheless believed that the above-mentioned tendency for significant amounts of As ions/atoms to be rejected (i.e., expelled) from NiSi films into the underlying Si is responsible for the observed interfacial roughness in view of the requirement for the relatively large As ions/atoms to transit, and thus damage, the NiSi/Si interface upon expulsion from the NiSi layer.

Figure 3B:
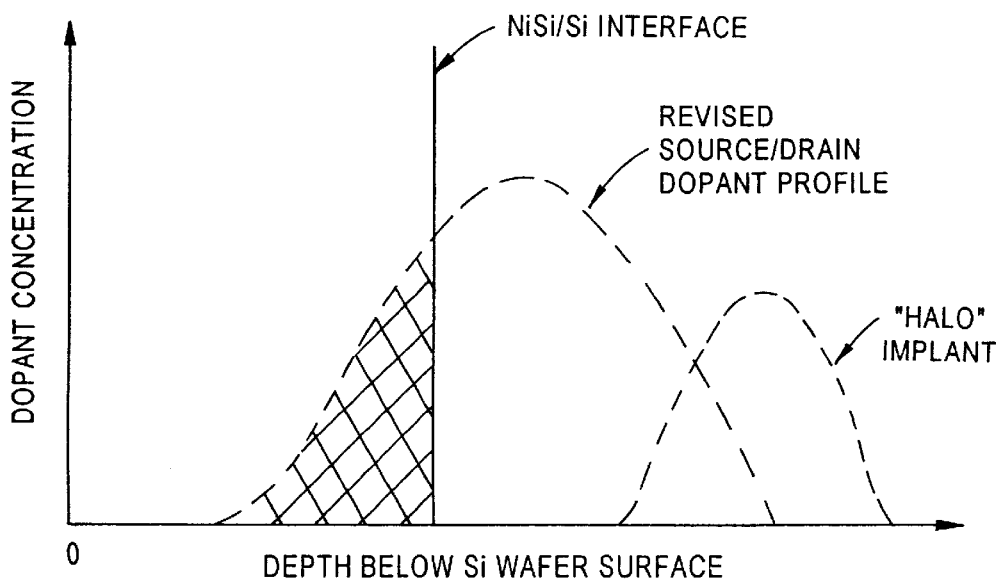

Referring now to FIG. 3(B), according to the invention, the conditions for performing the "main" implantation step of FIG. 1(F) are altered from those conventionally employed, so as to implant the Si wafer substrate with higher energy As n-type dopant ions, such that the concentration vs. depth profile of the implanted As ions exhibits (1) a very low level of As ions in a portion of the Si substrate extending from the surface thereof for a distance below the surface; and (2) a peak, or maximum, As concentration at a depth below the Si surface which is below (rather than near) the depth to which silicidation reaction occurs to form the NiSi layer, which depth is essentially unchanged from that of the conventional practice illustrated in FIG. 3(A). In general, the latter condition may be achieved by increasing the implantation energy from that utilized according to conventional implantation processing such as results in the depth vs. concentration profile shown in FIG. 3(A). By way of illustration only, suitable conditions for implantation of As n-type dopant ions into monocrystalline Si wafer substrates such that an As concentration vs. depth profile as illustrated in FIG. 3(B) is obtained, wherein the As concentration is very low at the Si surface and is at a maximum or peak concentration of about $1 \times 10^{20}$ da/cm$^3$ at a depth of from about 250 to about 500 Å below the Si surface, are: dosage of As ions of from about $3 \times 10^{15}$ to about $6 \times 10^{15}$ da/cm$^2$ at an energy of from about 35 to about 85 KeV.

The total amount, thus concentration, of As n-type dopant ions initially contained in the region or stratum of the Si substrate subsequently subjected to silicidation reaction with an overlying Ni layer to form NiSi is indicated in FIG. 3(B) by the double-hatched lines. As is apparent from the figure, the total amount or concentration of As ions at least initially present in the silicidation region or stratum (extending from the Si surface down to the indicated NiSi depth), and thus available for inclusion in the NiSi layer, is significantly lower than according to conventional practice, as shown in FIG. 3(A). As a consequence, according to the present invention, the concentration of As dopant ions present in the silicidation region or stratum is below the threshold value necessary for rough-textured NiSi/Si interfaces to occur in that the amount of rejected (i.e., expelled) As atoms/ions transiting the NiSi/Si interface is too low to result in interface damage leading to roughness thereof. As a further consequence, therefore, according to the present invention, local electrical punch-through or "spiking" of the source and drain/substrate junctions by refractory metal suicide layers, formed as part of salicide processing, is eliminated, or at least substantially reduced, resulting in high-quality, shallow source/drain junctions with decreased leakage currents.

Another advantageous feature of the inventive methodology, also shown in FIG. 3(B), is the formation of a "halo" implant of an opposite conductivity type dopant, i.e., a p-type dopant, typically a B-containing dopant, having a dopant concentration vs. depth profile exhibiting a peak or maximum at a depth below that of the As-containing dopant. While the peak concentration of the "halo" implant may be less than that of the primary (e.g., As-containing) implant, the "halo" implant of opposite conductivity type nonetheless serves to "anchor" the junction depth of the dopant profile, i.e., the depth at which the concentration of the primary dopant, i.e., As ions, drops to substrate doping levels at a depth below the indicated NiSi depth. By way of illustration only, implantation conditions for forming a B-containing "halo" implant for use in the illustrated embodiment, wherein a peak concentration of B-containing dopant ions of about $1 \times 10^{18}$ da/cm$^3$ is established at a depth of from about 450 to about 700 Å below the Si surface are: dosage of from about $3 \times 10^{13}$ to about $1 \times 10^{14}$ da/cm$^2$ and energy of from about 14 to about 22 KeV. The "halo" implant, e.g., of B-containing p-type dopant ions, may be performed prior or subsequent to the "main" implant of As n-type dopant ions.

As a consequence of the inventive methodology, deleterious formation of rough metal silicide/Si interfaces is avoided, or at least substantially minimized, so as to yield high-quality, low leakage current, shallow-depth source and drain junctions suitable for use in the fabrication of submicron-dimensioned MOS transistors and CMOS devices with improved operating characteristics. The inventive methodology is not limited to use with the illustrated combination of Ni as the metal and As-containing dopants, but rather is applicable to all manner of combinations of metals and dopant species wherein mutual incompatibilities result in disadvantageous degradation of interface quality, smoothness, and resultant junction and device properties. Thus, given the present disclosure and objectives of the invention, selection and/or determination of dopant-metal combinations and implantation conditions, etc., suitable for use in a particular application can be readily accomplished by one of ordinary skill. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing an NMOS transistor or CMOS semiconductor device, which method comprises the steps of:
   (a) providing a Si semiconductor substrate having a surface;
   (b) forming a thin gate insulator layer in contact with said substrate surface;
   (c) forming an electrically conductive gate electrode on a portion of said thin gate insulator layer, said gate electrode comprising first and second opposing side surfaces and a top surface;
   (d) forming a pair of shallow-depth, n-type source and drain extension regions in portions of said substrate, each of said source and drain extension regions extending laterally to beneath an edge of a respective one of said first and second opposing side surfaces of said gate electrode;
   (e) forming sidewall spacers composed of an insulating material on each of said first and second opposing side surfaces of said gate electrode;
   (f) forming, by implantation of As n-type dopant ions utilizing said sidewall spacers as an implantation mask, a pair of deeper, n-type source and drain regions in said source and drain regions formed in step (d), such that the concentration vs. depth profile of the implanted As ions has a peak at a first depth below said substrate surface;
   (g) implanting B-containing p-type dopant ions into said pair of n-type source and drain regions utilizing said sidewall spacers as an implantation mask, such that the concentration vs. depth profile of the implanted B-containing dopant ions has a peak at a second depth below said substrate surface, said second depth being greater than said first depth, whereby said first depth is limited by said second depth;
   (h) forming a layer of Ni on said substrate surface overlying at least said pair of source and drain regions; and
   (i) reacting said Ni layer to form a pair of electrically conductive NiSi layers extending into respective ones of said pair of source and drain regions for a third depth below said substrate surface, said third depth being less than said first depth, thereby eliminating or at least substantially reducing roughness of the interfaces between the NiSi layers and the As-doped source and drain regions by minimizing the concentration of As ions in said NiSi layers.

2. The method as in claim 1, comprising:
   performing step (f) followed by step (g).

3. The method as in claim 1, comprising:
   performing step (g) followed by step (f).

4. The method as in claim 1, wherein:
   step (d) comprises forming said pair of n-type source and drain extension regions at a shallow depth of from about 100 to about 200 Å;
   step (f) comprises implanting said As dopant ions at a dosage and energy such that said first depth is from about 250 to about 500 Å below said substrate surface;
   step (g) comprises implanting said B-containing dopant ions at a dosage and energy such that said second depth is from about 450 to about 700 Å below said substrate surface;
   step (h) comprises forming a Ni layer having a thickness of from about 100 to about 200 Å; and
   step (i) comprises reacting said Ni layer with said Si substrate to form a NiSi layer extending to said third depth below said substrate surface of from about 180 to about 360 Å.

5. The method as in claim 4, wherein:
   step (d) comprises implanting As ions at a dosage of from about $1 \times 10^{15}$ to about $2 \times 10^{15}$ da/cm$^2$ and energy of from about 2 to about 5 KeV;
   step (f) comprises implanting As ions at a dosage of from about $3 \times 10^{15}$ to about $6 \times 10^{15}$ da/cm$^2$ and energy of from about 35 to about 85 KeV;
   step (g) comprises implanting B-containing ions at a dosage of from about $3 \times 10^{13}$ to about $1 \times 10^{14}$ da/cm$^2$ and energy of from about 14 to about 22 KeV; and
   step (i) comprises heating said Ni layer in an inert atmosphere at from about 300 to about 550° C. for from about 30 to about 60 sec.

6. A method of manufacturing an NMOS transistor or CMOS semiconductor device, which method comprises the steps of:
   (a) providing a Si semiconductor substrate having a surface;
   (b) forming a thin gate insulator layer in contact with said substrate surface;
   (c) forming an electrically conductive gate electrode on a portion of said thin gate insulator layer, said gate electrode comprising first and second opposing side surfaces and a top surface;
   (d) forming, by implantation of first conductivity type dopant ions, a pair of shallow source and drain extension regions in portions of said substrate, each of said shallow source and drain extension regions extending laterally to beneath an edge of a respective one of said first and second opposing side surfaces of said gate electrode such that the concentration vs. depth profile of the implanted first conductivity ions has a peak at a shallow depth;
   (e) forming sidewall spacers composed of an insulating material on each of said first and second opposing side surfaces of said gate electrode;
   (f) forming, by implantation of first conductivity type dopant ions utilizing said sidewall spacers as an implantation mask, a pair of deeper source and drain regions in said shallow-depth source and drain regions formed in step (d), such that the concentration vs. depth profile of the implanted first conductivity type ions has a peak at a first depth below said substrate surface greater than the shallow depth;
   (g) implanting second conductivity type dopant ions into said pair of deeper source and drain regions utilizing said sidewall spacers as an implantation mask, such that the concentration vs. depth profile of the implanted second conductivity type dopant ions has a peak at a second depth below said substrate surface, said second depth being greater than said first depth, whereby said first depth is limited by said second depth;
   (h) forming a metal layer on said substrate surface overlying at least said pair of shallow-depth source and drain regions; and
   (i) reacting said metal layer to form a pair of electrically conductive metal silicide layers extending into respective ones of said pair of shallow-depth source and drain regions for a third depth below said substrate surface, said third depth being less than said first depth, thereby eliminating or at least substantially reducing roughness of the interfaces between the metal silicide layers and the shallow-depth source and drain regions by minimizing the concentration of first conductivity type ions in said metal silicide layers.

7. The method as in claim 6, wherein:

the first conductivity type dopant ion comprises at least one member selected from the group consisting of arsenic (As), phosphorus (P), and antimony (Sb).

8. The method as in claim 7, wherein:

said first conductivity type dopant ion is arsenic.

9. The method as in claim 6, wherein:

the second conductivity type dopant ion is a p-type dopant ion.

10. The method as in claim 9, wherein the p-type dopant ion is boron (B)-containing.

11. The method as in claim 6, comprising:

performing step (f) followed by step (g).

12. The method as in claim 6, comprising:

performing step (g) followed by step (f).

13. The method as in claim 6, wherein:

step (h) comprises forming a metal layer comprising at least one metal selected from the group consisting of: nickel (Ni), cobalt (Co), titanium (Ti), and platinum (Pt).

14. The method as in claim 13, wherein:

step (h) comprises forming a Ni layer; and step (i) comprises forming an electrically conductive NiSi layer.

15. The method as in claim 6, wherein:

said first conductivity dopant ion is arsenic;

said second conductivity dopant ion is boron;

step (h) comprises forming a Ni layer overlying at least said selected portions of said substrate; and step (i) comprises reacting said Ni layer with said Si-based substrate to form a layer of electrically conductive nickel silicide (NiSi).

16. The method as in claim 15, wherein:

step (a) comprises providing a monocrystalline Si wafer substrate;

step (f) comprises implanting As ions as said first dopant ions at a dosage and energy such that said first depth is from about 250 to about 500 Å below said substrate surface;

step (g) comprises implanting B-containing second dopant ions at a dosage and energy such that said second depth is from about 450 to about 700 Å below said substrate surface;

step (h) comprises forming a Ni layer having a thickness of from about 100 to about 200 Å; and step (i) comprises reacting said Ni layer with said Si substrate to form an electrically conductive NiSi layer extending to said third depth below said substrate surface of from about 180 to about 360 Å.

17. The method as in claim 16, wherein:

step (f) comprises implanting As ions at a dosage of from about $3 \times 10^{15}$ to about $6 \times 10^{15}$ da/cm$^2$ and energy of from about 35 to about 85 KeV;

step (g) comprises implanting B-containing ions at a dosage of from about $3 \times 10^{13}$ to about $1 \times 10^{14}$ da/cm$^2$ and energy of from about 14 to about 22 KeV; and step (h) comprises heating said Ni in an inert atmosphere at a temperature of from about 300 to about 550° C. for from about 30 to about 60 sec.

* * * * *